(12) United States Patent
Shi et al.

(10) Patent No.: US 9,691,835 B2
(45) Date of Patent: Jun. 27, 2017

(54) DOUBLE-FACE DISPLAY PANEL

(71) Applicant: BOE TECHNOLOGY GROUP CO., LTD., Beijing (CN)

(72) Inventors: Shiming Shi, Beijing (CN); Kazuyoshi Nagayama, Beijing (CN)

(73) Assignee: BOE TECHNOLOGY GROUP CO., LTD. (CN)

( * ) Notice: Subject to any disclaimer, the term of this patent is extended or adjusted under 35 U.S.C. 154(b) by 179 days.

(21) Appl. No.: 14/403,893

(22) PCT Filed: May 14, 2014

(86) PCT No.: PCT/CN2014/077411
§ 371 (c)(1),
(2) Date: Nov. 25, 2014

(87) PCT Pub. No.: WO2015/096356
PCT Pub. Date: Jul. 2, 2015

(65) Prior Publication Data
US 2016/0268362 A1 Sep. 15, 2016

(30) Foreign Application Priority Data

Dec. 24, 2013 (CN) .......................... 2013 1 0719208

(51) Int. Cl.
*H01L 27/32* (2006.01)
*H01L 51/52* (2006.01)

(52) U.S. Cl.
CPC ...... *H01L 27/3267* (2013.01); *H01L 51/5218* (2013.01); *H01L 51/5221* (2013.01)

(58) Field of Classification Search
CPC ............................... H01L 27/32; H01L 51/56
(Continued)

(56) References Cited

U.S. PATENT DOCUMENTS 7,355,338 B2 * 4/2008 Osame et al. ................. 313/503
7,750,552 B2 * 7/2010 Yamazaki et al. ............ 313/503
(Continued)

FOREIGN PATENT DOCUMENTS

CN         1765156 A       4/2006
CN       101163358 A       4/2008
(Continued)

OTHER PUBLICATIONS

Office Action in Chinese Patent Application No. 201310719208.4, dated Sep. 28, 2015.
(Continued)

*Primary Examiner* — Sheng Zhu
(74) *Attorney, Agent, or Firm* — Brooks Kushman P.C.

(57) ABSTRACT

The double-face display panel comprises a plurality of pixel units arranged in an array mode, and the pixel unit comprises an anode, a cathode, an organic material functional layer arranged between the anode and the cathode and at least one thin film transistor, wherein the anode comprises a transmission anode and a reflection anode, the cathode comprises a transmission cathode and a reflection cathode, the transmission anode at least corresponds to the reflection cathode, the transmission cathode at least corresponds to the reflection anode, and the reflection anode and the reflection cathode are arranged in a staggered mode; the transmission anode is electrically connected with a drain electrode of the thin film transistor, and the reflection anode is electrically connected with the drain electrode of the thin film transistor.

18 Claims, 8 Drawing Sheets

(58) Field of Classification Search
USPC ..... 257/40, 88, 100; 313/505, 506, 503, 512
See application file for complete search history.

(56) References Cited

U.S. PATENT DOCUMENTS

| | | | |
|---|---|---|---|
| 2004/0227159 A1* | 11/2004 | Nakashima et al. | 257/202 |
| 2008/0218091 A1* | 9/2008 | Jo et al. | 315/169.3 |
| 2009/0206727 A1 | 8/2009 | Kim | |
| 2010/0237374 A1 | 9/2010 | Chu et al. | |

FOREIGN PATENT DOCUMENTS

| | | | |
|---|---|---|---|
| CN | 101212025 A | 7/2008 |
| CN | 101556991 A | 10/2009 |
| CN | 101661948 A | 3/2010 |
| CN | 102024844 A | 4/2011 |
| CN | 102044555 A | 5/2011 |
| CN | 102169886 A | 8/2011 |
| CN | 103730484 A | 4/2014 |

OTHER PUBLICATIONS

International Search Report and Written Opinion in PCT International Application No. PCT/CN2014/077411, dated Aug. 6, 2014.
Office Action in Chinese Patent Application No. 201310719208.4, dated Apr. 25, 2016.
Office Action in Chinese Patent Application No. 201310719208.4, dated Jan. 29, 2016.

* cited by examiner

DOUBLE-FACE DISPLAY PANEL

CROSS-REFERENCE TO RELATED APPLICATION

This application is the U.S. national phase of PCT Application No. PCT/CN2014/077411 filed on May 14, 2014, which claims priority to Chinese Patent Application No. 201310719208.4 filed on Dec. 24, 2013, the disclosures of which are incorporated in their entirety by reference herein.

TECHNICAL FIELD

The embodiment of the present disclosure relates to the field of display technology, in particular to a double-face display panel.

BACKGROUND

An Organic Light Emitting Diode (hereinafter referred to as OLED) display panel has advantages such as self-illumination, low energy consumption, no dead angle, fast response and high contrast, and has strong competitiveness as compared with a liquid crystal display panel, so it is believed as a main development trend of the display panel in future. As shown in FIG. 1, the core part of an organic light emitting display panel is an OLED light emitting device with a sandwich structure, comprising a transmission anode 207, an organic material functional layer 208, and a reflection cathode 209.

Wherein, the material for making the transmission anode 207 is usually ITO (Indium Tin Oxide), and the reflection anode 209 comprises a metal reflection layer having a reflection function. The light emitting principle of OLED is to inject carrier holes in the transmission anode 207 and carrier electrons in the reflection cathode 209 to the organic material functional layer 208 by applying working voltages to the transmission anode 207 and the reflection cathode 209, and electrons and holes are composited in the organic material functional layer 208 to form electron-hole pairs and emit visible light from one side of the transmission anode 207.

Currently, the majority of display panels in the market are single-face display panel. In most cases, for example, in advertising facilities of public places such as digital Signage, electronic communication equipments, cashier facilities, window Inquirer facilities, and exhibition buildings, it is generally required to watch pictures displayed on both the front face and the back face of a display panel simultaneously by two persons. However, the double-face display panel in the related art is actually a combination of two independent display panels, and the internal structure thereof and the system for driving the two independent display panels to emit light are complex. This not only increases the production cost of the double-face display panel greatly, but also thickens the product, which does not comply with the trend of making the display panel lighter and thinner. As a result, how to make the whole double-face display panel lighter and thinner and make the driving circuits of the double-face display panel integrated becomes a key problem for development of the double-face display panel.

SUMMARY

An embodiment of the present disclosure provides a double-face display panel capable of displaying images on both a front face and a back face of the display panel.

In order to achieve the above purpose, an embodiment of the present disclosure uses the following technical solutions:

In one aspect, an embodiment of the present disclosure provides a double-face display panel, comprising a plurality of pixel units arranged in an array mode, and each pixel unit comprises an anode, a cathode, an organic material functional layer arranged between the anode and the cathode and at least one thin film transistor; wherein the anode comprises a transmission anode and a reflection anode, the cathode comprises a transmission cathode and a reflection cathode, the transmission anode at least corresponds to the reflection cathode, the transmission cathode at least corresponds to the reflection anode, and the reflection anode and the reflection cathode are arranged in a staggered mode; the transmission anode is electrically connected with a drain electrode of the thin film transistor, and the reflection anode is electrically connected with the drain electrode of the thin film transistor.

Alternatively, the number of the thin film transistor is one, wherein both the transmission anode and the reflection anode are electrically connected with the drain electrode of the one thin film transistor.

Alternatively, the number of the thin film transistors is two, namely a first thin film transistor and a second thin film transistor, wherein the drain electrode of the first thin film transistor is electrically connected with the transmission anode, and the drain electrode of the second thin film transistor is electrically connected with the reflection anode; the double-face display panel further comprises data lines, wherein the data lines comprise a first data line and a second data line; a source electrode of the first thin film transistor is electrically connected with the first data line, and a source electrode of the second thin film transistor is electrically connected with the second data line.

Further alternatively, gate electrodes of the first thin film transistor and the second thin film transistor are electrically connected with one gate line simultaneously.

Alternatively, both the reflection anode and the reflection cathode comprise a first transparent conductive pattern, a second transparent conductive pattern and a metal conductive pattern between the first transparent conductive pattern and the second transparent conductive pattern.

Alternatively, the organic material functional layer at least comprises a hole transport layer, a light emitting layer and an electron transport layer.

Further alternatively, the double-face display panel further comprises a filling layer arranged between the thin film transistor and an adjacent anode or cathode.

Alternatively, the double-face display panel further comprises a pixel isolation layer arranged between any two adjacent pixel units, the pixel isolation layer being configured to isolate adjacent pixel units.

Further alternatively, the double-face display panel further comprises a packaging layer for packaging and fixing the double-face display panel.

Alternatively, in the double-face display panel, the organic material functional layer further comprises an electron injection layer arranged between the cathode and the electron transport layer, and a hole injection layer arranged between the anode and the hole transport layer.

Alternatively, in the double-face display panel, the transmission anode and the reflection anode are arranged at a same layer.

Alternatively, in the double-face display panel, the transmission anode and the reflection anode are arranged into upper and lower layers.

Alternatively, in the double-face display panel, the anode is arranged close to the thin film transistor.

Alternatively, in the double-face display panel, the transmission anode is a portion corresponding to the reflection cathode, and the transmission cathode is a portion corresponding to the reflection anode.

Alternatively, in the double-face display panel, the transmission anode comprises a portion corresponding to the reflection cathode and a portion situated below the reflection anode, the transmission cathode comprises a portion corresponding to the reflection anode and a portion situated below the reflection cathode, and the reflection anode and the reflection cathode are arranged in a staggered mode.

An embodiment of the present disclosure provides a double-face display panel, comprising a plurality of pixel units arranged in an array mode, and each pixel unit comprises at least one thin film transistor, an anode, a cathode, and an organic material functional layer arranged between the anode and the cathode; wherein the anode comprises a transmission anode and a reflection anode, the cathode comprises a transmission cathode and a reflection cathode, the transmission anode at least corresponds to the reflection cathode, the transmission cathode at least corresponds to the reflection anode, and the reflection anode and the reflection cathode are arranged in a staggered mode; the transmission anode is electrically connected with a drain electrode of the thin film transistor, and the reflection anode is electrically connected with the drain electrode of the thin film transistor; the reflection anode and the reflection cathode are arranged on both sides of the organic material functional layer respectively and arranged in a staggered mode so that light emitted from the organic material functional layer can be still emitted from corresponding light-transmitting regions on both sides of the display panel, thereby achieving the purpose of displaying on both sides of the double-face display panel.

BRIEF DESCRIPTION OF THE DRAWINGS

In order to describe the embodiments of the present disclosure and the technical solutions in the prior art more clearly, the drawings used in the embodiments or the description of the prior art will be introduced below briefly. Obviously, the drawings described below are merely directed to some embodiments of the present disclosure. For a person skilled in the art, it is possible to obtain other drawings based on these drawings without involving inventive work.

REFERENCE NUMBER

Figure 1:
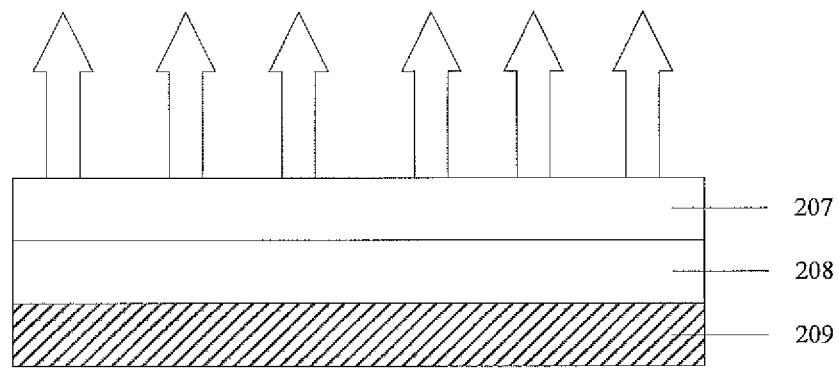
FIG. 1 is a schematic view showing a structure of an OLED light emitting device in a single-face display panel according to the related art.

100 substrate; 200 gate electrode; 202 source electrode; 203 drain electrode; 204 filling layer; 211 pixel isolation layer; 206 transmission cathode; 207 transmission anode; 208 organic material functional layer; 2081 electron injection layer; 2082 electron transport layer; 2083 light emitting layer; 2084 hole transport layer; 2085 hole injection layer; 209 reflection cathode; 210 reflection anode; 30 pixel unit; 31 first sub-pixel unit; 32 second sub-pixel unit; 40 thin film transistor; 41 first thin film transistor; 42 second thin film transistor; 43 gate driver; 44 source driver; 451 first data line; 452 second data line; 46 gate line.

DETAILED DESCRIPTION

The technical solution in the embodiments of the present disclosure will be described below clearly and fully in conjunction with the drawings therein. Obviously, the embodiment described is merely a part of embodiments other than all the embodiments. All embodiments obtained by an ordinary person skilled in the art without involving inventive work based on the embodiments of the present disclosure fall into the protection scope of the present disclosure.

An embodiment of the present disclosure provides a double-face display panel, comprising a plurality of pixel units arranged in an array mode, and as shown in FIGS. 2-12, each pixel unit 30 includes at least one thin film transistor (not shown in FIGS. 2, 3 and 12), an anode, a cathode, an organic material functional layer 208 arranged between the anode and the cathode, wherein the anode includes a transmission anode 207 and a reflection anode 210, the cathode comprises a transmission cathode 206 and a reflection cathode 209, the transmission anode 207 at least corresponds to the reflection cathode 209, the transmission cathode 206 at least corresponds to the reflection anode 210, and the reflection anode 210 and the reflection cathode 209 are arranged in a staggered mode; and the transmission anode 207 is electrically connected with a drain electrode of the thin film transistor, and the reflection anode 210 is electrically connected with the drain electrode of the thin film transistor.

Wherein the thin film transistor includes a gate electrode 200, a gate insulating layer, a semiconductor active layer, a source electrode 202 and a drain electrode 203.

The organic material functional layer 208 at least includes an electron transport layer 2082, a light emitting layer 2083 and a hole transport layer 2084. In order to improve the efficiency of electrons and holes injecting the light emitting layer 2083, the organic material functional layer 208 further includes an electron injection layer 2081 arranged between the cathode and the electron transport layer 2082, and a hole injection layer 2085 arranged between the anode and the hole transport layer 2084.

It has to be indicated that, firstly, the thin film transistor 40 is a semiconductor unit having a switch characteristic, e.g., it may be an amorphous silicon thin film transistor, a low-temperature polycrystalline silicon thin film transistor, an oxide thin film transistor, or an organic thin film transistor, which are not limited herein.

Secondly, the anode may be arranged close to the thin film transistor 40, in which case, the organic material functional layer 208 is arrange on the anode, and the cathode is arranged on the organic material function layer 208; or the cathode is arranged close to the thin film transistor 40, in which case, the organic material functional layer 208 is arranged on the cathode, and the anode is arranged on the organic material functional layer 208. Positions of the anode and the cathode with respect to the thin film transistor 40 are not limited in the embodiment.

Figure 2:
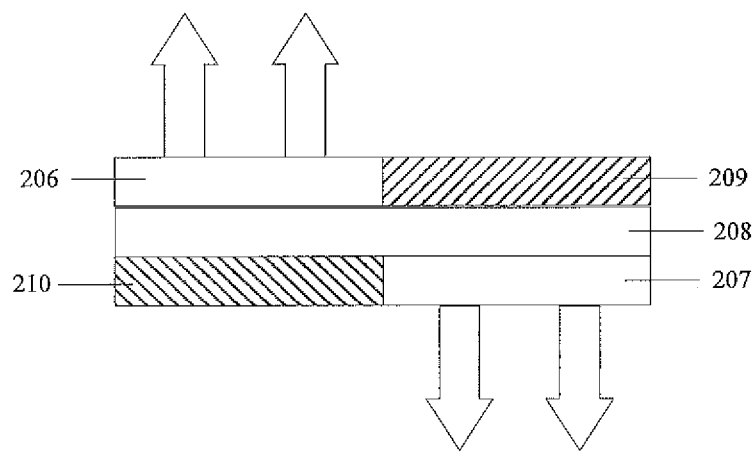
FIG. 2 is a schematic view showing a structure of a anode, a cathode and an organic material functional layer in a double-face display panel according to an embodiment of the present disclosure.
Figure 3:
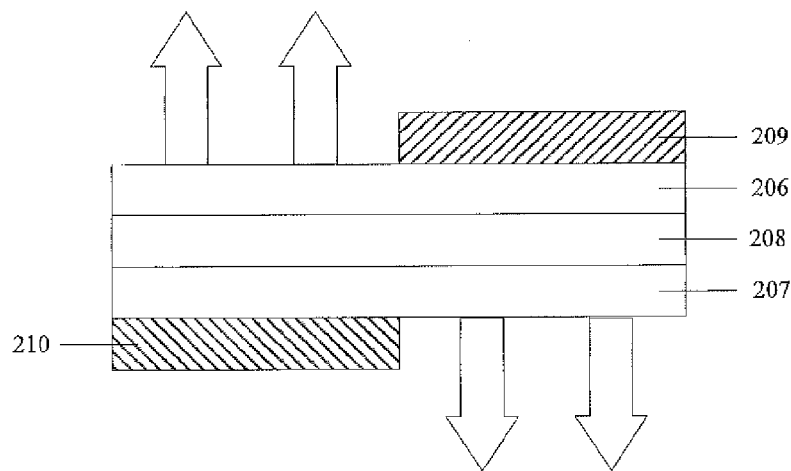
FIG. 3 is a schematic view showing another structure of a anode, a cathode and an organic material functional layer in a double-face display panel according to an embodiment of the present disclosure.

Thirdly, the transmission anode 207 and the reflection anode 210 may be arranged on the same layer, or into upper and lower layers. When the transmission anode 207 and the reflection anode 210 are arranged into upper and lower layers, the transmission anode 207 can be arranged on one side close to the organic material functional layer 208 as shown in FIG. 3. When the transmission anode 207 and the reflection anode 210 are arranged on the same layer, the transmission anode 207 and the reflection anode 210 can be arranged in a manner as shown in FIG. 2. The same reason also applies to the transmission cathode 206 and the reflection cathode 209, which is not stated here again.

Fourthly, it has to be indicated that all drawings in the embodiment of the present disclosure are rough schematic views of pixel units 30 only for describing the structure relevant to the inventive point in the solution clearly. As for other structures irrelevant to the inventive point, being existing structures, they are not illustrated or partially illustrated in the drawings.

With the double-face display panel according to the embodiment of the present disclosure, when applying work voltages to both the anode and the cathode of the double-face display panel, holes in the anode and electrons in the cathode are both injected into the organic material functional layer 208, and the holes and the electrons meet in the organic material functional layer 208. The two are composited due to the effect of Coulomb force to form electron-hole pairs and release energy. The energy is emitted in the form of light, and the light goes through different luminescent molecules in the organic material functional layer 208 to display light with different colors and emit uniformly from both sides of the organic material functional layer 208. The reflection anode 210 and the reflection cathode 209 are arranged on both sides of the organic material functional layer respectively and arranged in a staggered mode so that light emitted from the organic material functional layer can be still emitted from a corresponding light-transmitting region on both sides of the display panel, thereby achieving the purpose of displaying on both sides of the double-face display panel. Besides, it is possible to meet the requirement for luminance of images displayed on both side of the double-face display panel.

Figure 4:
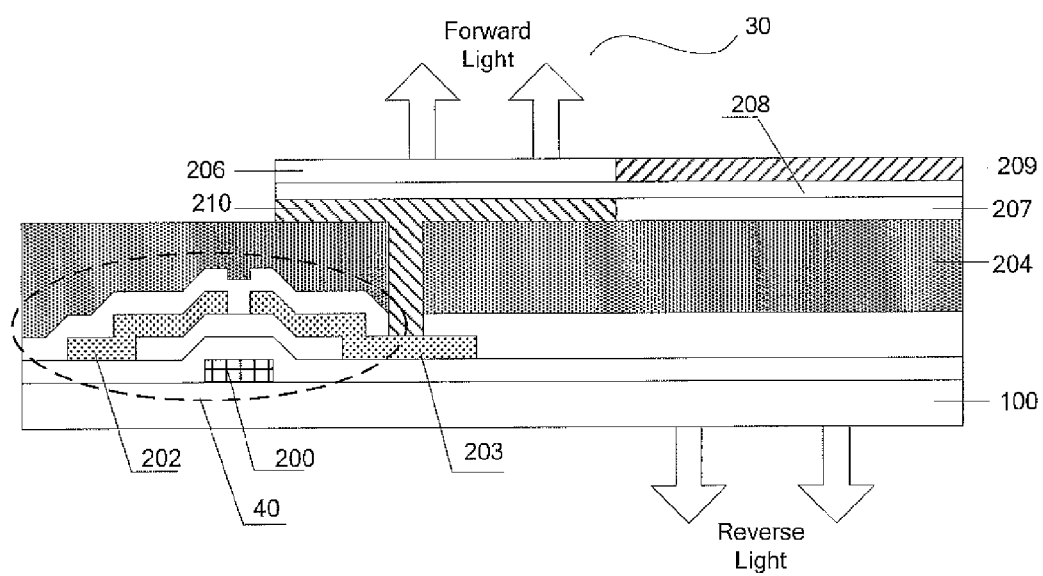
FIG. 4 is a schematic view showing a section structure of one pixel unit in the double-face display panel according to an embodiment of the present disclosure.
Figure 5:
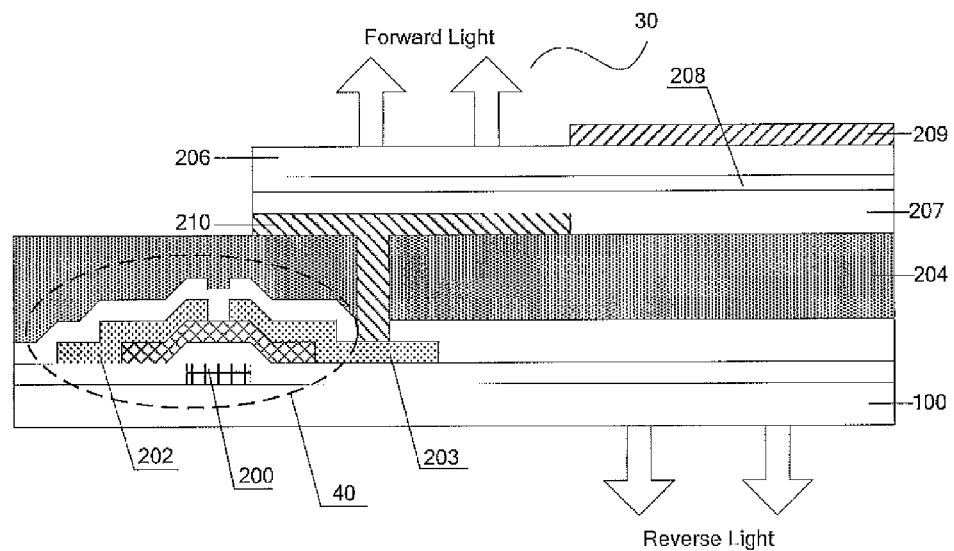
FIG. 5 is a schematic view showing another section structure of one pixel unit in the double-face display panel according to an embodiment of the present disclosure.

Alternatively, as shown in FIG. 4 or 5, any one of the pixel units 30 comprises one thin film transistor 40, in which case, both the transmission anode 207 and the reflection anode 210 are electrically connected with the drain electrode 203 of the one thin film transistor.

Like this, as shown in FIG. 4, as for any one of the pixel units 30, the light emitted from a forward direction of the organic material functional layer 208 includes two parts: one part of forward light emitted directly from the transmission cathode 206, and the other part emitted from the transmission cathode 206 corresponding to the reflection anode 210 via the reflection action of the reflection anode 210, so that the light emitted from the forward direction is emitted merely from a forward light-transmitting region. Likewise, the light emitted from a reverse direction of the organic material functional layer 208 includes two parts: one part of reverse light emitted directly from the transmission anode 207, and the other part emitted from the transmission anode 207 corresponding to the reflection cathode 209 via the reflection action of the reflection cathode 209, so that the light emitted from the reverse direction is emitted merely from a reverse light-transmitting region.

Or, as shown in FIG. 5, as for any one of the pixel units 30, the light emitted from a forward direction of the organic material functional layer 208 includes two parts: one part of forward light emitted directly from the transmission cathode 206 which is not shaded by the reflection cathode 209, and the other part emitted from the transmission cathode 206 corresponding to the reflection anode 210 via the reflection action of the reflection anode 210, so that the light emitted from the forward direction is emitted merely from the forward light-transmitting region. Likewise, the light emitted from a reverse direction of the organic material functional layer 208 includes two parts: one part of reverse light emitted directly from the transmission anode 207 which is not shaded by the reflection anode 210, and the other part emitted from the transmission anode 207 corresponding to the reflection cathode 209 via the reflection action of the reflection cathode 209, so that the light emitted from the reverse direction is emitted merely from the reverse light-transmitting region.

Figure 6:
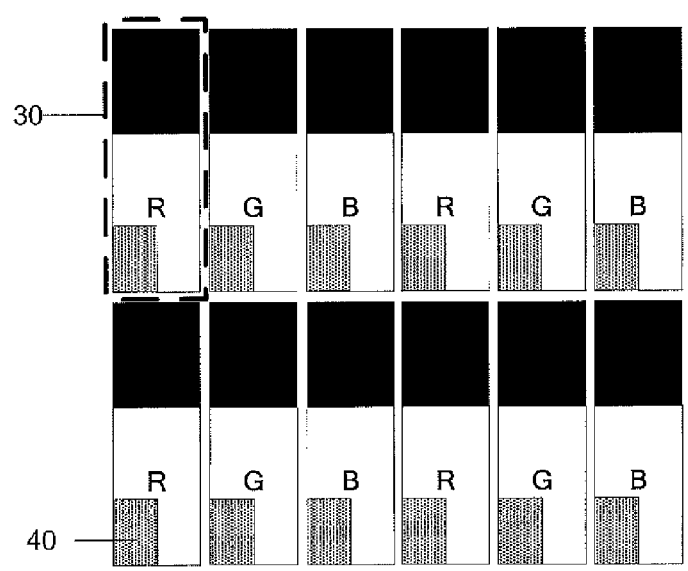
FIG. 6 is a schematic view showing a forward light-transmitting region of a pixel array in the double-face display panel according to an embodiment of the present disclosure.
Figure 7:
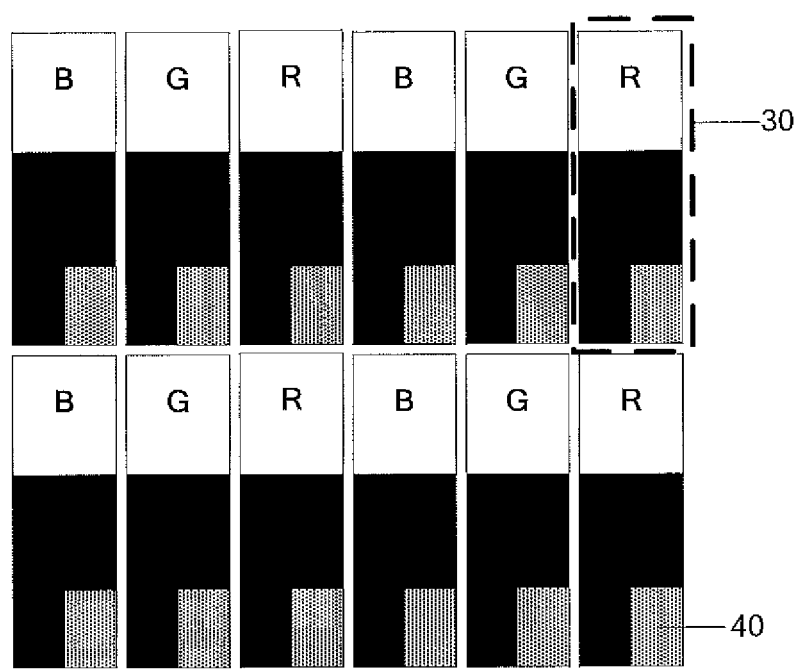
FIG. 7 is a schematic view showing a reverse light-transmitting region of a pixel array in the double-face display panel according to an embodiment of the present disclosure.

As for the double-face display panel comprised of a plurality of pixel units 30 (which is marked into R, G or B in FIGS. 6 and 7) arranged in an array mode, it is possible to display images on the front face of the double-face display panel in a pixel array as shown in FIG. 6, and display images on the back face of the double-face display panel in a pixel array as shown in FIG. 7.

Here, since the number of the thin film transistors 40 included any one of the pixel units 30 is one, the same picture will be displayed on both front side and back side of the same pixel unit and have the same gray level.

It has to be indicated that, as shown in FIGS. 4 and 5, in one pixel unit 30, since the light emitted by compositing of the electrons and the holes in organic material functional layer 208 is emitted from both sides of the organic material functional layer 208, light emitted from the above of the organic material functional layer 208 is a forward light in the embodiment of the present disclosure, and likewise, light emitted from the below of the organic material functional layer 208 is a reverse light. Moreover, since the forward light is emitted via the transmission cathode 206, a transmission cathode 206 region corresponding to the direction of emitting the forward light and above the organic material functional layer 208 is referred to as a forward light-transmitting region, and likewise, a transmission anode 207 region corresponding to the direction of emitting the reverse light and below the organic material functional layer 208 is referred to as a reverse light-transmitting region.

Figure 8:
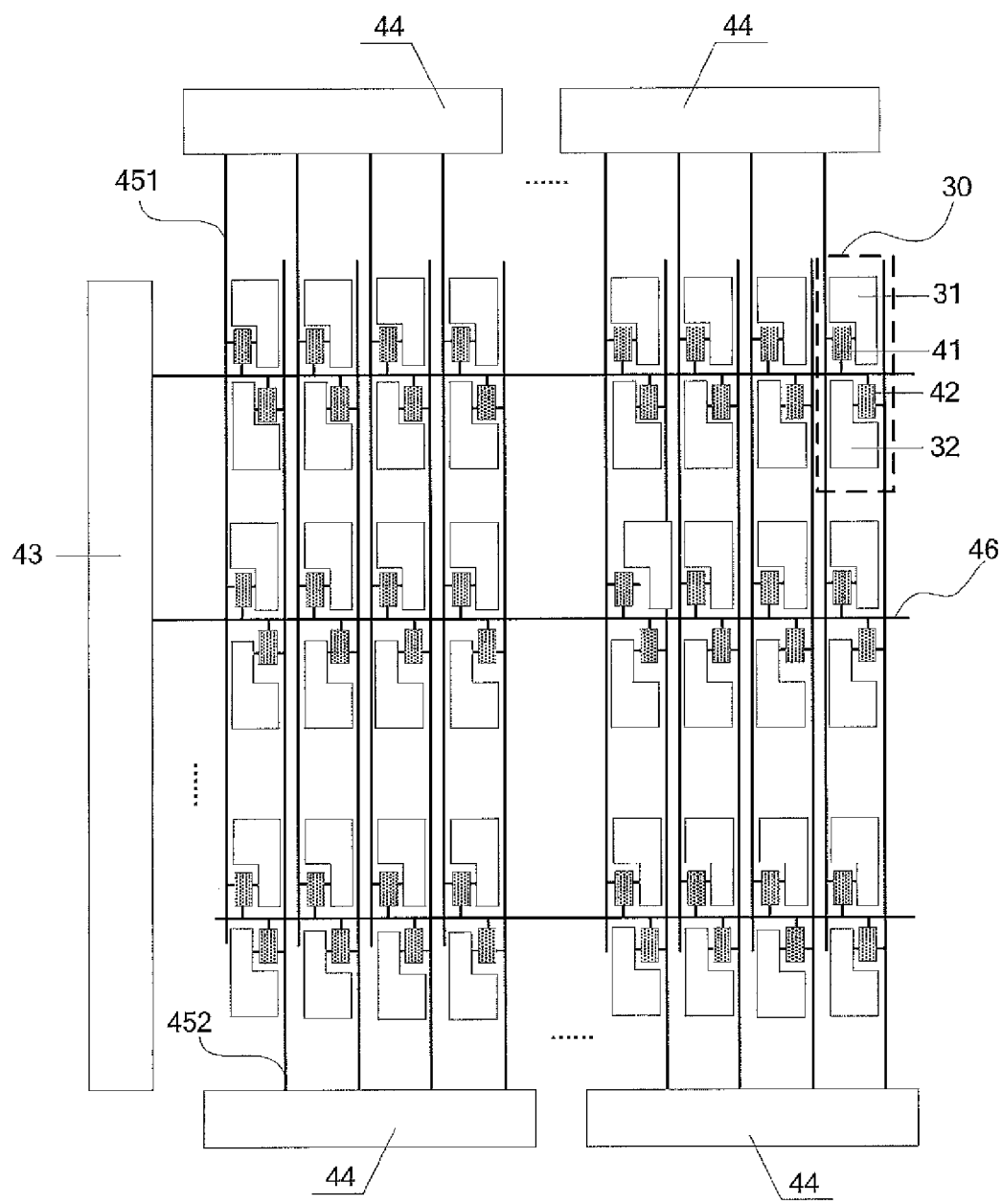
FIG. 8 is a schematic view showing the connection of pixel units and a driving circuit in the double-face display panel according to an embodiment of the present disclosure.

Alternatively, as shown in FIG. 8, any one of pixel units 30 includes two thin film transistors, and the two thin film transistors are a first thin film transistor 41 and a second thin film transistor 42. The double-face display panel further includes data lines, wherein the data lines include a first data line 451 and a second data line 452, in which case, the drain electrode 203 of the first thin film transistor 41 may be electrically connected with the transmission anode 207, and the drain electrode 203 of the second thin film transistor 42 may be electrically connected with the reflection anode 210; correspondingly, a source electrode 202 of the first thin film transistor 41 may be electrically connected with the first data line 451, and a source electrode 202 of the second thin film transistor 42 may be electrically connected with the second data line 452.

Further alternatively, gate electrodes 200 of the first thin film transistor 41 and the second thin film transistor 42 are electrically connected simultaneously with one gate line 46.

Of course, it is possible to further include a gate driver 43 connected with the gate line 46, and a source driver 44 connected with the first data line 451 and the second data line 452.

Here, one pixel unit 30 may includes a first sub-pixel unit 31 and a second sub-pixel unit 32, the first sub-pixel unit 31 includes the first thin film transistor 41, the transmission anode 207 electrically connected with the drain electrode 203 of the first thin film transistor 41, the reflection cathode 209, and the organic material functional layer 208 positioned in the middle, wherein the transmission anode 207 is a transmission anode 207 portion corresponding to the reflection cathode 209, the second sub-pixel unit 32 includes the second thin film transistor 42, the reflection anode 210 electrically connected with the drain electrode 203 of the second thin film transistor 42, the transmission cathode 206, and the organic material functional layer 208 positioned in the middle, wherein the transmission cathode 206 is a transmission cathode 206 portion corresponding to the reflection anode 210.

Since both the transmission anode 207 and the reflection anode 210 are positioned on the same side of the organic material functional layer 208 (here, for example, positioned below the organic material functional layer 208), both the transmission cathode 206 and the reflection cathode 209 are positioned on the same side of the organic material functional layer 208 (here, for example, positioned above the organic material functional layer 208), and the reflection anode 210 and the reflection cathode 209 are arranged in a stagger mode. Therefore, the second sub-pixel unit 32 includes the reflection anode 210 and the transmission cathode 206 such that the light emitted from the forward direction of the organic material functional layer 208 can be only emitted from the forward light-transmitting region, i.e., the transmission cathode 206 of the second sub-pixel unit 32; and likewise, the first sub-pixel unit 31 includes the transmission anode 207 and the reflection cathode 209 such that the light emitted from the reverse direction of the organic material functional layer 208 can be only emitted from the reverse light-transmitting region, i.e., the transmission anode 207 of the first sub-pixel unit 31.

Figure 9:
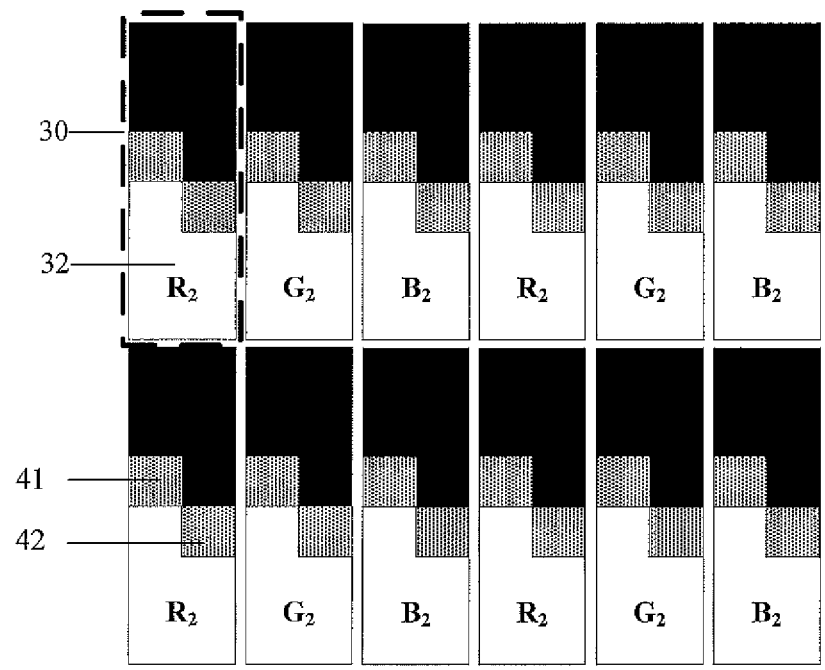
FIG. 9 is a schematic view showing another forward light-transmitting region of a pixel array in the double-face display panel according to an embodiment of the present disclosure.
Figure 10:
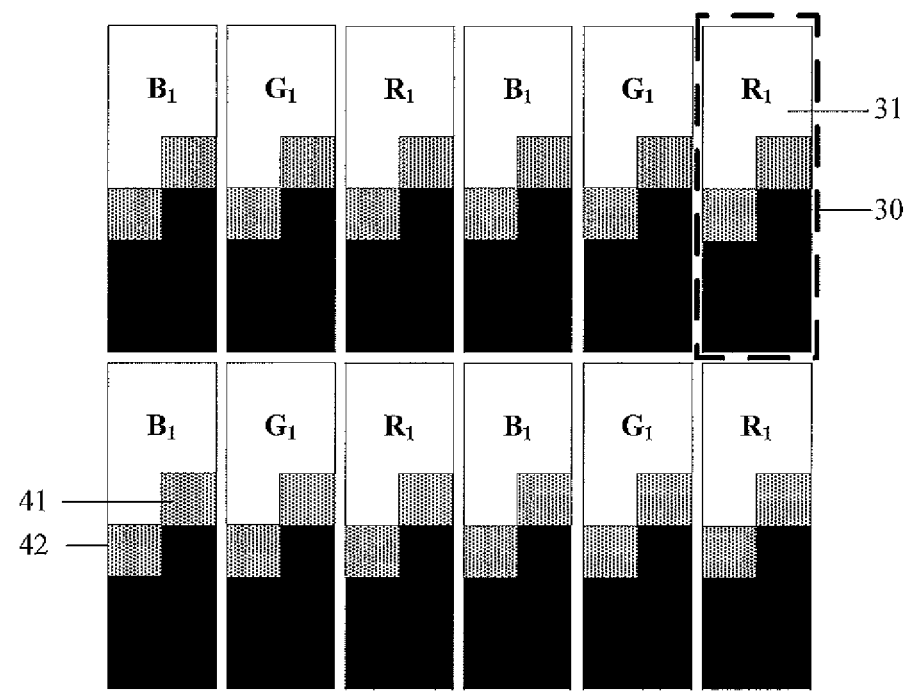
FIG. 10 is a schematic view showing another reverse light-transmitting region of a pixel array in the double-face display panel according to an embodiment of the present disclosure.

With respect to the double-face display panel comprised of a plurality of pixel units 30 arranged in an array mode, on the front face of the double-face display panel, it is possible to display pictures via a plurality of second sub-pixel units 32 arranged in an array mode (marked with R2, G2 or B2) as shown in FIG. 9; on the back face of the double-face display panel, it is possible to display pictures via a plurality of first sub-pixel units 31 arranged in an array mode (marked with R1, G1 or B1) as shown in FIG. 10, wherein the first sub-pixel unit 31 and the second sub-pixel unit 32 include independent thin film transistors 40 respectively, so that the first sub-pixel unit 31 and the second sub-pixel unit 32 can display respectively, and thereby achieving the purpose of displaying independent pictures on both faces of the double-face display panel.

Further, both the reflection anode 210 and the reflection cathode 209 may include a first transparent conductive pattern, a second transparent conductive pattern and a metal conductive pattern between the first transparent conductive pattern and the second transparent conductive pattern.

Here, it has to be indicated that the material of the transparent conductive patterns may be, for example, Indium Tin Oxide (ITO), or aluminum-doped zinc oxide (AZO), which can conduct electricity and have high transmittance in the visible light region; the material of the metal conductive pattern may be a metal element such as: Cr, Cu, Au, Ag, Pt, Mo, Mg, Ca, Ba, and Al, or an alloy thereof.

Currently, it is generally the anode that is electrically connected with the drain electrode 203 of the thin film transistor 40, therefore, in consideration of complex preparation process, alternatively, the anode is arranged close to the thin film transistor 40, that is, after preparing the thin film transistor, the anode is formed firstly and then the organic material functional layer 208 and the cathode are formed.

Further alternatively, with reference to FIG. 4 or 5, the double-face display panel further includes a filling layer 204 arranged between the thin film transistor 40 and an adjacent anode, the filling layer 204 provides the anode with a flat substrate.

Of course, the cathode may be also arranged close to the thin film transistor 40. Correspondingly, the filling layer 204 is arranged between the thin film transistor 40 and the cathode.

Alternatively, the double-face display panel further includes a pixel isolation layer 211 arranged between any two adjacent pixel units 30, the pixel isolation layer 211 is configured to isolate adjacent pixel units 30, prevent occurrence of light interference among light emitted from different pixel units and affecting double-face display effect.

Further, since the method for forming the organic material functional layer 208 may be either by evaporation or by ink jet print, when using the ink jet print to make the organic material functional layer 208, the pixel isolation layer 211 is arranged in any one of pixel units 30 so as to prevent light emitting compounds from being mixed with each other when making a light emitting layer 2083 by ink jet print.

Further alternatively, the double-face display panel further includes a packaging layer for isolating oxygen and water in the air to destroy OLED light emitting devices. The packaging layer may be a folding glass substrate, or a layer of thin film, which is not limited herein.

Hereinafter, two specific embodiments will be provided to describe the double-face display panel in detail.

Embodiment One

Figure 11:
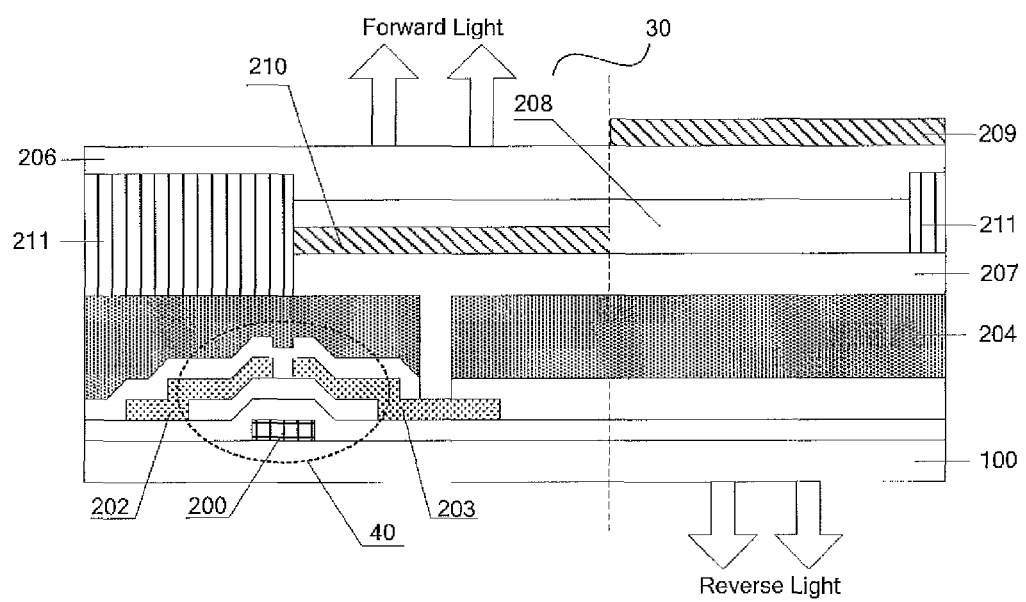
FIG. 11 is a schematic view showing the section structure of one pixel unit in the double-face display panel according to embodiment one of the present disclosure.

Embodiment One of the present disclosure provides a double-face display panel including a plurality of pixel units in an array mode, as shown in FIG. 11, each pixel unit includes a thin film transistor 40, an anode, a cathode, and an organic material functional layer 208 arranged between the anode and the cathode, the anode is electrically connected with a drain electrode of the thin film transistor 40, and the anode is arranged close to the thin film transistor 40; the double-face display panel further includes a filling layer 211 arranged between the thin film transistor 40 and the anode; a pixel isolation layer 211 arranged between any two adjacent pixel units, the pixel isolation layer being configured to isolate adjacent pixel units; and a packaging layer for packaging and fixing the double-face display panel.

Wherein the anode includes a transmission anode 207 and a reflection anode 210, and the cathode comprises a transmission cathode 206 and a reflection cathode 209. The transmission anode 207 includes a portion corresponding to the reflection cathode 209 and a portion situated below the reflection anode 210, the transmission cathode 206 includes a portion corresponding to the reflection anode 210 and a portion situated below the reflection cathode 209, and the reflection anode 210 and the reflection cathode 209 are arranged in a staggered mode. Both the reflection anode 210 and the reflection cathode 209 include a first ITO layer, a second ITO layer, a metal element Ag conductive pattern between the first ITO layer and the second ITO layer.

Figure 12:
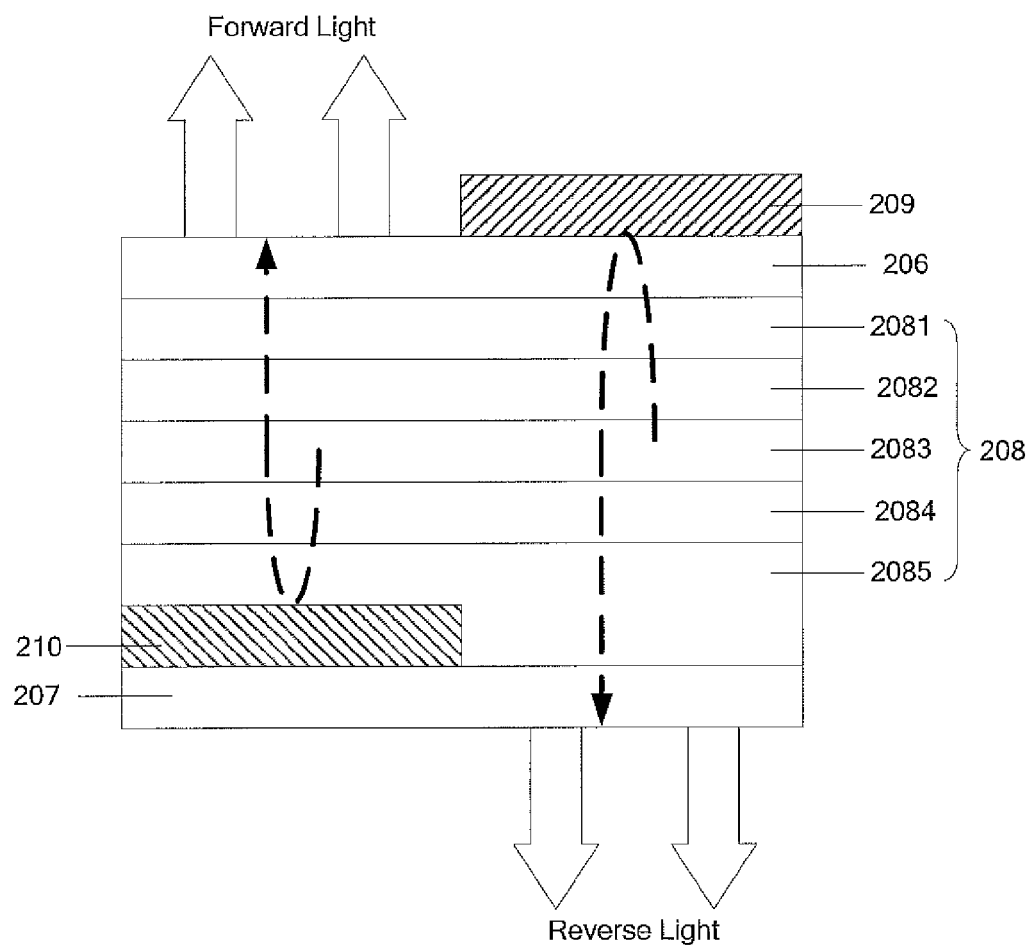
FIG. 12 is a schematic view showing the structure of an anode, a cathode and an organic material functional layer in the double-face display panel according to embodiment one of the present disclosure.

In order to improve efficiency of holes and electrons excited by the anode and the cathode being injected into the light emitting layer 2083, as shown in FIG. 12, the organic material functional layer 208 includes a hole injection layer 2085, a hole transport layer 2084, a light emitting layer 2083, an electron injection layer 2081, and an electron transport layer 2082.

Furthermore, the double-face display panel includes a filling layer 204 arranged between the thin film transistor 40 and the anode, and a pixel isolation layer 211 arranged between any two adjacent pixel units, the pixel isolation layer 211 is configured to isolate adjacent pixel units; and a packaging layer for packaging and fixing the double-face display panel is further included.

Like this, as for any one of the pixel units 30, the light emitted from a forward direction of the organic material functional layer 208 includes two parts: one part of forward light emitted directly from the transmission cathode 206 which is not shaded by the reflection cathode 209, and the other part emitted from the transmission cathode 206 corresponding to the reflection anode 210 via the reflection action of the reflection anode 210, so that the light emitted from the forward direction is emitted merely from the forward light-transmitting region. Likewise, the light emitted from a reverse direction of the organic material functional layer 208 includes two parts: one part of reverse light emitted directly from the transmission anode 207 which is not shaded by the reflection anode 210, and the other part emitted from the transmission anode 207 corresponding to the reflection cathode 209 via the reflection action of the reflection cathode 209, so that the light emitted from the reverse direction is emitted merely from the reverse light-transmitting region. As for the double-face display panel comprised of a plurality of pixel units 30 arranged in an array mode, it is possible to display images on the front face of the display panel in a pixel array as shown in FIG. 6, and display images on the back face of the display panel in a pixel array as shown in FIG. 7.

Embodiment Two

Embodiment Two of the present disclosure provides a double-face display panel including a plurality of pixel units 30 in an array mode; as shown in FIG. 8, any one of pixel units 30 includes a first sub-pixel unit 31 and a second sub-pixel unit 32, the first sub-pixel unit 31 includes a first thin film transistor 41, the transmission anode 207 electrically connected with a drain electrode 203 of the first thin film transistor 41, the reflection cathode 209, and an organic material functional layer 208 arranged in the middle, wherein the transmission anode 207 is a transmission anode 207 portion corresponding to the reflection cathode 209, the second sub-pixel unit 32 includes a second thin film transistor 42, a reflection anode 210 electrically connected with a drain electrode 203 of the second thin film transistor 42, a transmission cathode 206, and an organic material functional layer 208 positioned in the middle, wherein the transmission cathode 206 is a transmission cathode 206 portion corresponding to the reflection anode 210.

Wherein, as shown in FIG. 8, a source electrode 202 of the first thin film transistor 41 is electrically connected with a first data line 451, the source electrode 202 of the second thin film transistor 42 is electrically connected with the second data line 452, and gate electrodes 200 of the first thin film transistor 41 and the second thin film transistor 42 are electrically connected simultaneously with one gate line 46. Of course, a gate driver 43 connected with the gate line 46, and a source driver 44 connected with the first data line 451 and the second data line 452 are further included.

As shown in FIG. 12, the organic material functional layer 208 includes a hole injection layer 2085, a hole transport layer 2084, a light emitting layer 2083, an electron transport layer 2082, and an electron injection layer 2081. Both the reflection anode 210 and the reflection cathode 209 include a first ITO layer, a second ITO layer, and a metal element Ag conductive pattern between the first ITO layer and the second ITO layer.

Furthermore, the double-face display panel includes a filling layer 204 arranged between two thin film transistors and the anode, and a pixel isolation layer 211 arranged between any two adjacent pixel units, the pixel isolation layer 211 is configured to isolate adjacent pixel units; and a packaging layer for packaging and fixing the double-face display panel is further included.

Like this, the light emitted from the forward direction of the organic material functional layer 208 can be only emitted from the forward light-transmitting region, i.e., the transmission cathode 206 of the second sub-pixel unit 32; and likewise, the light emitted from the reverse direction of the organic material functional layer 208 can be only emitted from the reverse light-transmitting region, i.e., the transmission anode 207 of the first sub-pixel unit 31. Therefore, on the front face of the double-face display panel, it is possible to display pictures via a plurality of second sub-pixel units 32 arranged in an array mode as shown in FIG. 9; on the back face of the double-face display panel, it is possible to display pictures via a plurality of first sub-pixel units 31 arranged in an array mode as shown in FIG. 10, wherein the first sub-pixel unit 31 and the second sub-pixel unit 32 include independent thin film transistors 40 respectively, so that the first sub-pixel unit 31 and the second sub-pixel unit 32 display respectively, and thereby achieving the purpose of displaying independent pictures on both faces of the double-face display panel.

With respect to the above-mentioned double-face display panel, an embodiment of the present disclosure further provides a method for preparing a double-face display panel including a plurality of pixel units 30 arranged in an array mode. The method for preparing one of the pixel units 30 includes: forming, on a substrate 100, at least one thin film transistor 40, an anode, a cathode, and an organic material functional layer 208 positioned between the anode and the cathode.

Wherein, the anode includes a transmission anode 207 and a reflection anode 210, the cathode includes a transmission cathode 206 and a reflection cathode 209, the transmission anode 207 at least corresponds to the reflection cathode 209, the transmission cathode 206 at least corresponds to the reflection anode 210, and the reflection anode 210 and the reflection cathode 209 are arranged in a staggered mode; the transmission anode 207 is electrically connected with a drain electrode 203 of the thin film transistor 40, and the reflection anode 210 is electrically connected with the drain electrode 203 of the thin film transistor 40.

It has to be indicated that the substrate may be made of a glass material or a transparent flexible plastic material, which is not limited herein.

Alternatively, both the reflection anode 210 and the reflection cathode 209 include a first transparent conductive pattern, a second transparent conductive pattern and a metal conductive pattern between the first transparent conductive pattern and the second transparent conductive pattern.

Alternatively, as shown in FIG. 4 or 5, the number of the thin film transistor is one. Both the transmission anode 207 and the reflection anode 210 are electrically connected with the drain electrode 203 of one thin film transistor.

Alternatively, as shown in FIG. 8, the number of the thin film transistor 40 is two, and the two thin film transistors include a first thin film transistor 41 and a second thin film transistor 42, wherein the drain electrode 203 of the first thin film transistor is electrically connected with the transmission anode 207, and the drain electrode 203 of the second thin film transistor is electrically connected with the reflection anode 210. Based on this, the method further includes: forming a first data line 451 electrically connected with the source electrode 202 of the first thin film transistor, and a second data line 452 electrically connected with the source electrode 202 of the second thin film transistor.

Wherein data lines are formed on the double-face display panel, wherein the data lines include the first data line 451 and the second data line 452.

Further alternatively, the method for preparing the double-face display panel includes: forming a gate line 46 electrically connected with the gate electrodes 200 of the first thin film transistor 41 and the second thin film transistor 42 simultaneously.

Alternatively, the anode is formed close to the thin film transistor 40.

Alternatively, as shown in FIG. 4 or 5, the method further includes: forming a filling layer 204 between the thin film transistor 40 and the anode close to the thin film transistor 40, the filling layer 204 being configured to provide the anode with one flat substrate.

Of course, the cathode may be arranged close to the thin film transistor 40, and correspondingly, the filling layer 204 is arranged between the thin film transistor 40 and the cathode.

Alternatively, as shown in FIG. 11, the method further includes: forming a pixel isolation layer 211 between any two adjacent pixel units 30, the pixel isolation layer 211 is configured to isolate adjacent pixel units, prevent the occurrence of light interference among light emitted from different pixel units and affecting double-face display effect.

Here, it is possible to make the pixel isolation layer 211 configured to isolate adjacent pixel units 30 after the making of the anode. The material of the pixel isolation layer 211 may be an opaque photosensitive resin, or a transparent photosensitive resin. Alternatively, the transparent photosensitive resin is used.

After the pixel isolation layer 211 is patterned, the organic material functional layer 208 is made between any adjacent pixel isolation layer 211, wherein the organic material functional layer 208 at least includes a hole transport layer 2084, a light emitting layer 2083, and an electron transport layer 2082.

Based on this, alternatively, as shown in FIG. 12, the organic material functional layer 208 includes a hole injection layer 2085, a hole transport layer 2084, a light emitting layer 2083, an electron injection layer 2081, and an electron transport layer 2082.

Here, the organic material function layer 208 may be made either by evaporation, or by ink jet print.

After the making of the organic material functional layer 208, the cathode is formed by making.

Here, since the organic material functional layer 208 has been formed, when the cathode is formed on the organic material functional layer 208, high temperature in preparing the cathode shall be avoided. Thus, alternatively, low temperature deposition and etching process or other low temperature process, for example, the process for preparation of a metal and ITO solution, is adopted.

Based on this, alternatively, the method further includes: forming a packaging layer for isolating oxygen and water in the air to destroy OLED light emitting devices. The packaging layer may be a folding glass substrate, or a layer of thin film, which is not limited herein.

It has to be indicated that although in the embodiments of the present disclosure, taking the fact that the source electrode of the thin film transistor is connected with the data line so that the drain electrode of the thin film transistor is electrically connected with the anode for example, the description is given, a person skilled in the art shall understand that, due to the interchangeability of the source electrode and the drain electrode of the thin film transistor in structure and composition, it is possible to connect the drain electrode of the thin film transistor with the data line so that the source electrode of the thin film transistor is electrically connected with the anode, which belongs to equivalent replacement of the embodiment.

The above are merely the embodiments of the present disclosure, but the protection scope of the present disclosure is not limited thereto. All persons skilled in the art can easily envisage the variation or alternatives within the scope disclosed in the present disclosure, which shall be contained in the protection scope of the present disclosure. Therefore, the protection scope of the present disclosure shall be based on the protection scope of the claims.

What is claimed is:

1. A double-face display panel, comprising a plurality of pixel units arranged in an array mode, wherein each pixel unit comprises an anode, a cathode, an organic material functional layer arranged between the anode and the cathode and one thin film transistor;

wherein the anode comprises a transmission anode and a reflection anode, the cathode comprises a transmission cathode and a reflection cathode, the transmission anode at least corresponds to the reflection cathode, the transmission cathode at least corresponds to the reflection anode, and the reflection anode and the reflection cathode are arranged in a staggered mode;

the transmission anode is in direct physical contact with the reflection anode, and one of the transmission anode and the reflection anode are in direct physical contact with the drain electrode of the one thin film transistor.

2. The double-face display panel according to claim 1, wherein the number of the thin film transistors is two, the two thin film transistors are a first thin film transistor and a second thin film transistor;

the drain electrode of the first thin film transistor is electrically connected with the transmission anode, and the drain electrode of the second thin film transistor is electrically connected with the reflection anode;

the double-face display panel further comprises data lines, wherein the data lines comprise a first data line and a second data line;

a source electrode of the first thin film transistor is electrically connected with the first data line, and a source electrode of the second thin film transistor is electrically connected with the second data line.

3. The double-face display panel according to claim 2, wherein gate electrodes of the first thin film transistor and the second thin film transistor are electrically connected with one gate line simultaneously.

4. The double-face display panel according to claim 1, wherein both the reflection anode and the reflection cathode comprise a first transparent conductive pattern, a second transparent conductive pattern and a metal conductive pattern between the first transparent conductive pattern and the second transparent conductive pattern.

5. The double-face display panel according to claim 1, wherein the organic material functional layer at least comprises a hole transport layer, a light emitting layer and an electron transport layer.

6. The double-face display panel according to claim 1, wherein the double-face display panel further comprises a filling layer arranged between the thin film transistor and an adjacent anode or cathode.

7. The double-face display panel according to claim 1, further comprising a pixel isolation layer arranged between any two adjacent pixel units, the pixel isolation layer being configured to isolate adjacent pixel units.

8. The double-face display panel according to claim 1, further comprising a packaging layer for packaging and fixing the double-face display panel.

9. The double-face display panel according to claim 5, wherein the organic material functional layer further comprises an electron injection layer arranged between the cathode and the electron transport layer, and a hole injection layer arranged between the anode and the hole transport layer.

10. The double-face display panel according to claim 1, wherein the transmission anode and the reflection anode are arranged at a same layer.

11. The double-face display panel according to claim 1, wherein the transmission anode and the reflection anode are arranged into upper and lower layers.

12. The double-face display panel according to claim 1, wherein the anode is arranged close to the thin film transistor.

13. The double-face display panel according to claim 1, wherein the transmission anode is a portion corresponding to the reflection cathode, and the transmission cathode is a portion corresponding to the reflection anode.

14. The double-face display panel according to claim 1, wherein the transmission anode comprises a portion corresponding to the reflection cathode and a portion situated below the reflection anode, the transmission cathode comprises a portion corresponding to the reflection anode and a portion situated below the reflection cathode, and the reflection anode and the reflection cathode are arranged in a staggered mode.

15. The double-face display panel according to claim 2, wherein both the reflection anode and the reflection cathode comprise a first transparent conductive pattern, a second transparent conductive pattern and a metal conductive pattern between the first transparent conductive pattern and the second transparent conductive pattern.

16. The double-face display panel according to claim 3, wherein both the reflection anode and the reflection cathode comprise a first transparent conductive pattern, a second transparent conductive pattern and a metal conductive pattern between the first transparent conductive pattern and the second transparent conductive pattern.

17. The double-face display panel according to claim 2, wherein the organic material functional layer at least comprises a hole transport layer, a light emitting layer and an electron transport layer.

18. A double-face display panel, comprising a plurality of pixel units arranged in an array mode and a pixel isolation layer arranged between any two adjacent pixel units, wherein each pixel unit comprises an anode, a cathode, an organic material functional layer arranged between the anode and the cathode and one thin film transistor, the anode comprises a transmission anode and a reflection anode, the cathode comprises a transmission cathode and a reflection cathode, the transmission anode at least corresponds to the reflection cathode, the transmission cathode at least corresponds to the reflection anode, and the reflection anode and the reflection cathode are arranged in a staggered mode, the transmission anode is in direct physical contact with the reflection anode, and one of the transmission anode and the reflection anode are in direct physical contact with the drain electrode of the one thin film transistor, the pixel isolation layer is configured to isolate adjacent pixel units.

* * * * *